(12) United States Patent
Shibata et al.

(10) Patent No.: US 10,254,872 B2
(45) Date of Patent: Apr. 9, 2019

(54) OPERATION APPARATUS

(71) Applicant: DENSO CORPORATION, Kariya, Aichi-pref. (JP)

(72) Inventors: Syunsuke Shibata, Nishio (JP); Motoki Tachiiri, Nishio (JP); Masahiro Itoh, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/740,402

(22) PCT Filed: Jul. 5, 2016

(86) PCT No.: PCT/JP2016/069843
§ 371 (c)(1),
(2) Date: Dec. 28, 2017

(87) PCT Pub. No.: WO2017/010338
PCT Pub. Date: Jan. 19, 2017

(65) Prior Publication Data
US 2018/0188875 A1 Jul. 5, 2018

(30) Foreign Application Priority Data

Jul. 14, 2015 (JP) ................................ 2015-140769

(51) Int. Cl.
*H03K 17/94* (2006.01)
*H03M 11/00* (2006.01)
(Continued)

(52) U.S. Cl.
CPC .......... *G06F 3/0414* (2013.01); *G06F 3/0202* (2013.01); *G06F 3/023* (2013.01);
(Continued)

(58) Field of Classification Search
CPC ................................ G06F 3/0414; G06F 3/044
(Continued)

(56) References Cited

U.S. PATENT DOCUMENTS

2002/0175836 A1* 11/2002 Roberts .................. G06F 3/0414
341/34
2004/0027761 A1* 2/2004 Fukui ...................... G06F 3/041
361/100

(Continued)

FOREIGN PATENT DOCUMENTS

JP          S5706341 U      4/1982
JP          2004527847 A    9/2004
(Continued)

*Primary Examiner* — Tanmay K Shah
(74) *Attorney, Agent, or Firm* — Harness, Dickey & Pierce, P.L.C.

(57) ABSTRACT

An operation apparatus includes: an operation plate on which an operation surface performed by a pressing operation with an operation body; an assembly member assembled with the operation plate; a first elastic member opposite to the operation surface with respect to the operation plate, and between the operation plate and the assembly member to be elastically deformable by a pressing force applied by the operation body; a sensor detecting an elastic deformation changing amount of the first elastic member generated by the pressing operation; a pressing determinator determining whether the pressing operation is performed based on a detection value of the sensor; and a second elastic member between the operation plate and the assembly member to be elastically deformable with the first elastic member by the pressing force. The first and second elastic members are arranged to enable the pressing force applied serially.

4 Claims, 6 Drawing Sheets

(51) Int. Cl.
*G06F 3/041* (2006.01)
*G06F 3/023* (2006.01)
*H01H 13/00* (2006.01)
*G06F 3/044* (2006.01)
*G06F 3/02* (2006.01)
*H01H 3/02* (2006.01)
*H03K 17/96* (2006.01)

(52) U.S. Cl.
CPC ........... *G06F 3/044* (2013.01); *H01H 3/0213* (2013.01); *H01H 13/00* (2013.01); *H03K 17/96* (2013.01)

(58) Field of Classification Search
USPC .......................................................... 341/20
See application file for complete search history.

(56) References Cited

U.S. PATENT DOCUMENTS

| | | | |
|---|---|---|---|
| 2011/0025631 A1* | 2/2011 | Han | G06F 3/0414 345/173 |
| 2011/0175845 A1 | 7/2011 | Honda et al. | |
| 2016/0062516 A1* | 3/2016 | Jeong | G06F 3/044 345/174 |
| 2016/0188025 A1* | 6/2016 | Park | G06F 3/041 52/784.15 |
| 2016/0282999 A1* | 9/2016 | Hwang | G06F 3/044 |

FOREIGN PATENT DOCUMENTS

| | | |
|---|---|---|
| JP | 2011100364 A | 5/2011 |
| JP | 2014142914 A | 8/2014 |

\* cited by examiner

OPERATION APPARATUS

CROSS REFERENCE TO RELATED APPLICATIONS

This application is a U.S. National Phase Application under 35 U.S.C. 371 of International Application No. PCT/JP2016/069843 filed on Jul. 5, 2016 and published in Japanese as WO 2017/010338 A1 on Jan. 19, 2017. This application is based on and claims the benefit of priority from Japanese Patent Application No. 2015-140769 filed on Jul. 14, 2015. The entire disclosures of all of the above applications are incorporated herein by reference.

TECHNICAL FIELD

The present disclosure relates to an operation apparatus, which is operated by pressing an operation surface of an operation plate.

BACKGROUND ART

Conventionally, it has been known that an operation apparatus performs a pressing operation on an operation plane of an operation plate with an operator's fingertip (operation body), and outputs a detection signal according to the pressing force. The operation apparatus includes: an assembly member mounted to the operation plate; an elastic member that is arranged between the operation plate and the assembly member and is deformed elastically with the pressing force exerted by the operation body; and a sensor that detects a changing amount of the elastic deformation (elastic deformation changing amount).

Accordingly, when the changing amount of a sensor's output value is larger than or equal to a predetermined threshold value, it is determined to have a pressing operation, and then a command signal corresponding to the pressing operation such as a signal for commanding a vehicular air conditioner to start operation is outputted.

However, variation may occur in an initial deformation amount of the elastic member at an initial state in which the pressing operation is not performed. The variation is caused by the assembly tolerance of the operation plate and the assembly member. In a situation where a characteristic line, which represents a relation between the elastic deformation changing amount generated by the pressing operation (pressing amount) and the sensor's output value is illustrated as a curved line (non-linear), the variation occurs and the accuracy for determining whether it is the pressing operation becomes worsen. For example, in a situation where the characteristic lines are exemplified in FIGS. 5 and 6, the sensor changing amounts $\Delta S$ are different even when the pressing amounts $\Delta L$ are identical.

PRIOR ART LITERATURES

Patent Literature

Patent Literature 1: JP 2011-100364 A

SUMMARY OF INVENTION

It is an object of the present disclosure to provide an operation apparatus that improves accuracy in determining whether a pressing operation is performed.

An operation apparatus according to an aspect of the present disclosure includes: an operation plate on which an operation surface is configured to be performed by a pressing operation with an operation body; an assembly member that is assembled with the operation plate; a first elastic member that is arranged to be opposite to the operation surface with respect to the operation plate, and that is arranged between the operation plate and the assembly member to be elastically deformed by a pressing force applied by the operation body; a sensor that detects an elastic deformation changing amount of the first elastic member generated by the pressing operation; a pressing determinator that determines whether the pressing operation is performed based on a detection value of the sensor; and a second elastic member that is arranged between the operation plate and the assembly member, and that is configured to be elastically deformed with the first elastic member by the pressing force. The first elastic member and the second elastic member are arranged such that the pressing force is applied to the first elastic member and the second elastic member serially.

Accordingly, the tolerance caused by the assembly of the operation plate and the assembly member is absorbed by the initial deformation amount (a first initial deformation amount) of the first elastic member and the initial deformation amount (a second initial deformation amount) of the second elastic member at an initial state in which the pressing operation is not performed. Therefore, the first initial deformation amount decreases as much as the second initial deformation amount. Thus, the variation in the first initial deformation amount caused by the assembly tolerance gets smaller. The detection target of the sensor is the first elastic member, and the second elastic member is not the detection target. Hence, the variation in the first initial deformation amount gets smaller so that the accuracy in determining whether the pressing operation is performed improves.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
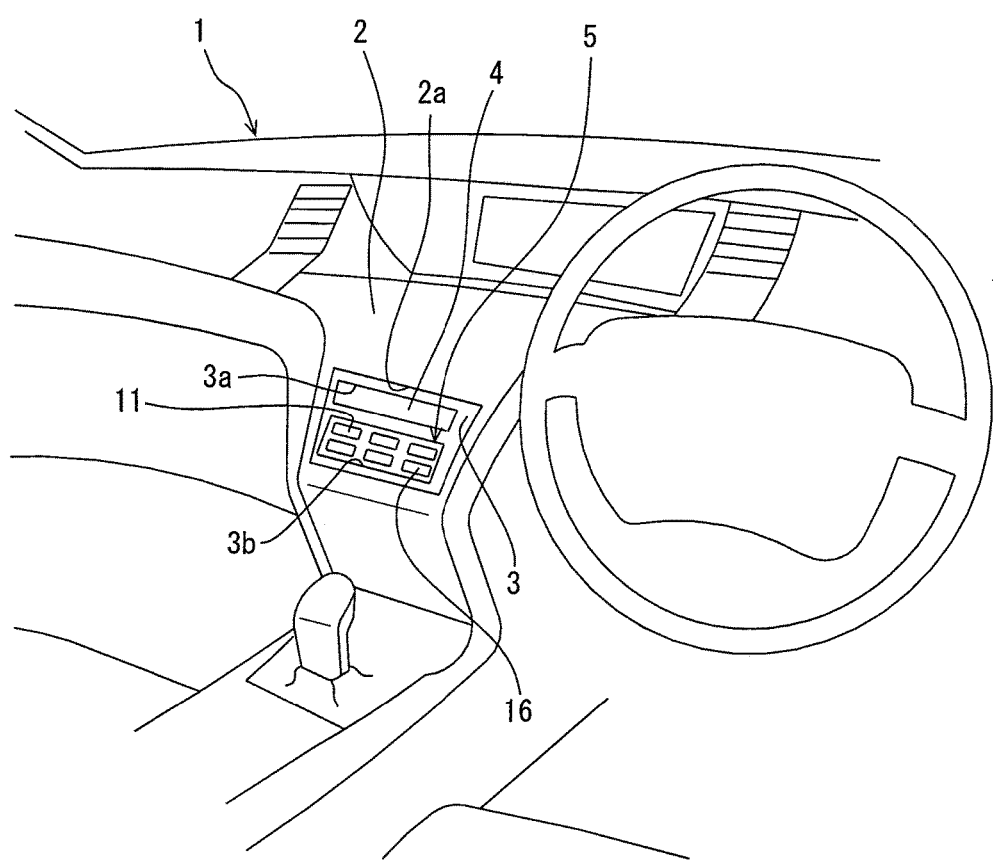
FIG. 1 is a perspective view that illustrates a mounting position of an operation apparatus in a vehicle according to a first embodiment of the present disclosure.

The following describes a plurality of embodiments for carrying out an operation apparatus according to the present disclosure with reference to the drawings. In some embodiments, the repetitive descriptions for some parts, which are appended by the same reference numerals and described in a preceding embodiment, are omitted. In some embodiments, in a case where only one part of the configuration is described, with regard to the other parts of the configuration, it is applicable to refer to other embodiments which are previously described.

First Embodiment

FIG. 1 is a perspective view that illustrates an instrumental panel 2 mounted to a vehicle 1 which is seen from a compartment. A display device 4 and an operation apparatus 5 are mounted to a central portion of the instrumental panel 2 in a vehicular left-and-right direction. In particular, a panel 3 is mounted to an opening 2a formed at the instrumental panel 2. The display surface of the display device 4 and the front surface of the operation apparatus 5 are exposed from the opening 2a formed at the panel 3. The display device 4 displays a content set by a vehicle passenger as a user who operates the operation apparatus 5.

Figure 2:
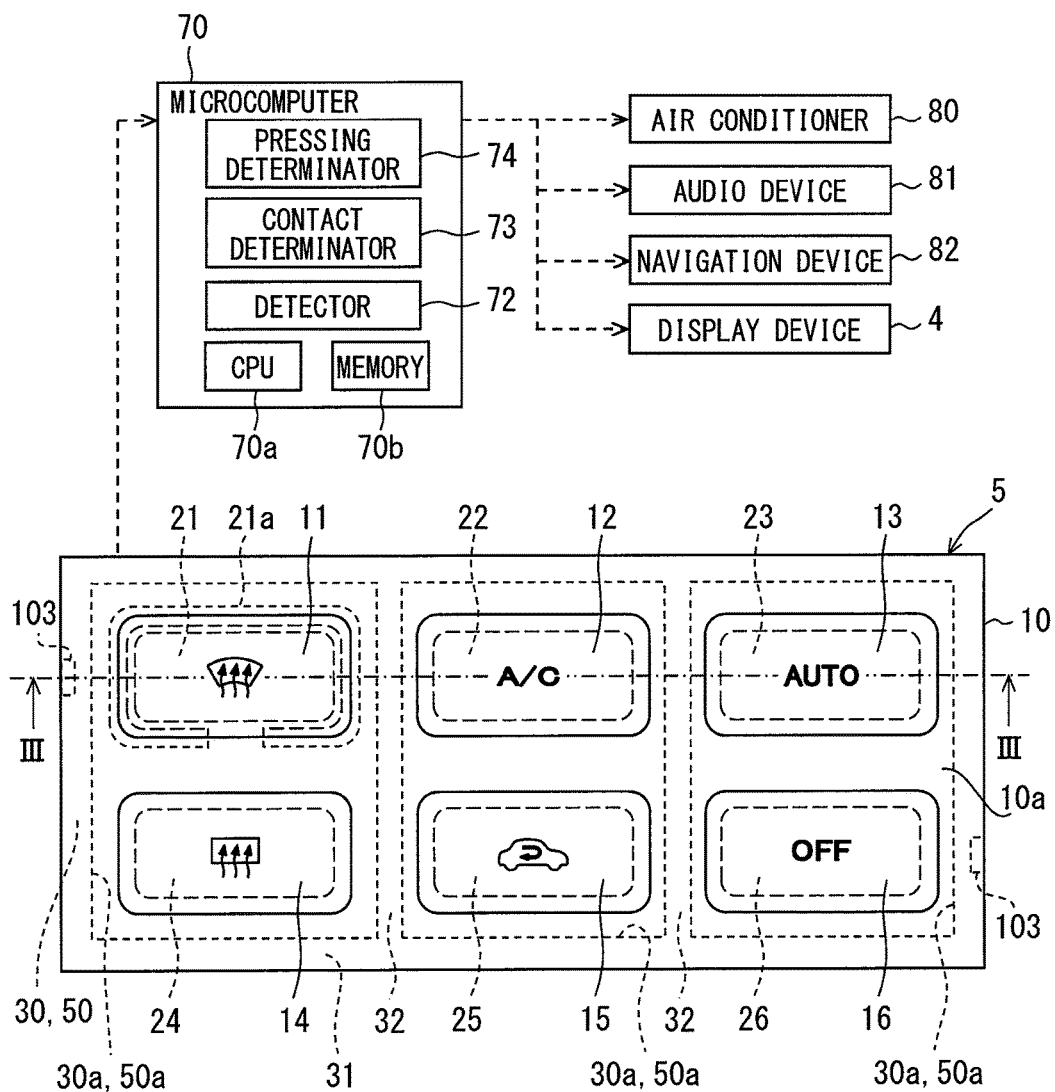
FIG. 2 is a front view that illustrates the operation apparatus shown in FIG. 1.
Figure 3:
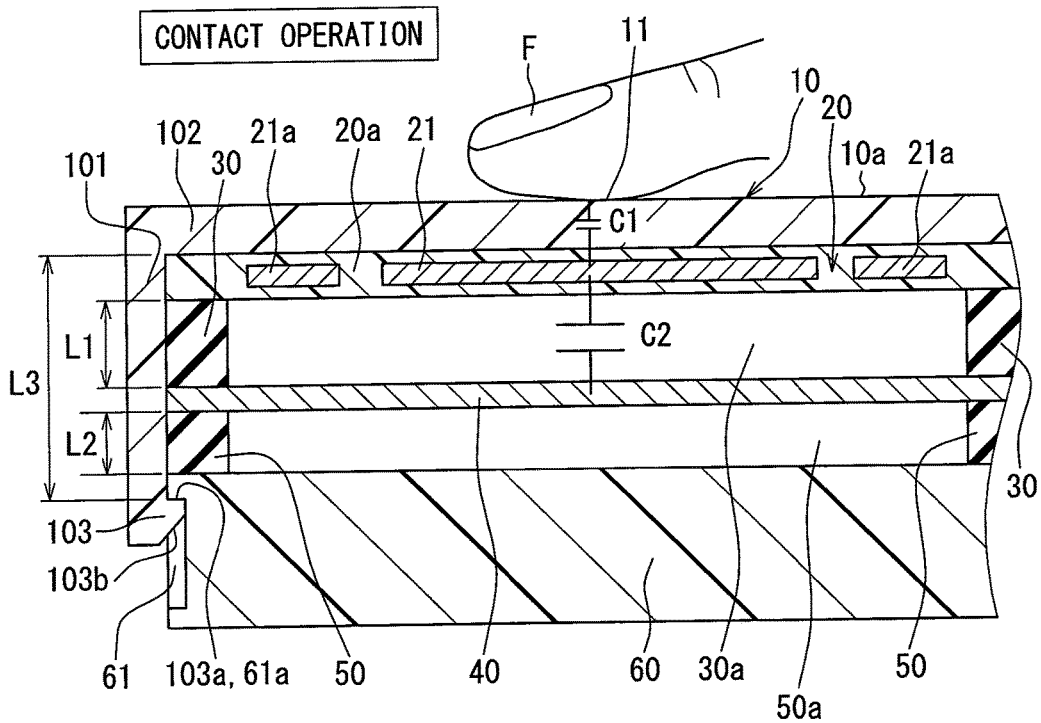
FIG. 3 is a cross sectional view taken along the III-III line shown in FIG. 2, and illustrates a state in which a contact operation is performed.

As shown in FIGS. 2 and 3, the operation apparatus 5 includes: an operation plate 10, a first electrode sheet 20, a first elastic member 30, a second electrode 40, a second elastic member 50, an assembly member 60 and a microcomputer 70.

The operation plate 10 is a member made of resin, and is formed in a bottomed cylindrical body having a cylindrical part 101 and a bottom part 102. A decorated surface 10a is formed at the bottom part 102 which is visually recognized by a user. The decorated surface 10a includes a plurality of operation surfaces 11, 12, 13, 14, 15 and 16. Characters, signs figures or the like, which represent a setting content for an operation target, are printed on these operation surfaces 11 to 16. In an example illustrated in FIG. 1, the operation target is an air conditioner 80 for ventilation of the compartment. For example, the activation, setting the air flow amount and temperature for the air conditioner 80 are particular examples the above setting contents. The cylindrical part 101 has a cylindrical shape extended from the periphery of the bottom part 102 to a side, which is opposite to the decorated surface 10a. An extended end part of the cylindrical part 101 is mounted to the assembly member 60 made of resin. The configuration of this assembly is described hereinafter.

When a user performs a contact operation by touching the operation surfaces 11 to 16 with a fingertip F, the corresponding setting content may be changed. For example, it is configured that an image of content for notifying which one of the operation surfaces is selected by a contact operation on the plurality of operation surfaces 11 to 16 to be displayed on the display device 4. When a setting change is caused by the contact operation, an alarm sound is generated for notifying the matter. In a state where the setting can be changed, when a user performs a pressing operation on the operation surfaces 11 to 16 with the fingertip F, the corresponding setting content is changed. For example, when the contact operation is performed on the operation surface 13, the setting of the automatic control of the air conditioner 80 can be changed, and the on/off setting of automatic control can be switched when the pressing operation is performed on the operation surface 13. For example, when the automatic control is switched to an on setting, a command signal for commanding this operation is outputted to the air conditioner 80 from the microcomputer 70, and then the switching of the air supply or air flow amount of ventilated air is automatically controlled.

The first electrode sheet 20 is pasted at the surface of the operation plate 10 opposite to the decorated surface 10a. The first electrode sheet 20 has a plurality of first electrodes 21, 22, 23, 24, 25, 26 and a ground electrode 21a. The first electrodes 21 to 26 and the ground electrode 21a are held by a resin-made sheet 20a. The first electrodes 21 to 26 are arranged at respective positions, which are opposite to the corresponding operation surfaces 11 to 16. The ground electrode 21a is formed in a shape that extends along the periphery of the first electrodes 21 to 26. FIG. 2 illustrates the ground electrode 21a that extends along the periphery of the first electrode 21, and the illustration of the ground electrode along the other first electrodes 22 to 26 is omitted.

At the opposite side of the operation plate 10 with respect to the first electrode sheet 20, a second electrode 40 with a sheet shape is arranged to be separated from the operation plate 10 with only a predetermined distance. The first elastic member 30 is arranged between the first electrode sheet 20 and the second electrode 40. The predetermined distance corresponds to the thickness L1 of the first elastic member 30. A second elastic member 50 is arranged to be opposite to the first elastic member 30 with respect to the second electrode 40.

The first elastic member 30 and the second elastic member 50 are made of material having elasticity such as sparkling resin or rubber. The thicknesses L1, L2 at a state without having elastic deformation are set to be the same for the first elastic member 30 and the second elastic member 50. However, the longitudinal elastic modulus of the first elastic member 30 is set to be smaller than the longitudinal elastic modulus of the second elastic member 50. In other words, the first elastic member 30 is easily to be softened and deformed as compared to the second elastic member 50.

The first elastic member 30 includes a frame part 31 and a bridge part 32. The frame part 31 has a round shape that extends along the periphery of the decorated surface 10a. The bridge part 32 has a linear shape that connects the inner side of the frame part 31. A plurality of openings 30a are provided at the inner side of the frame part 31. Viewing from the decorated surface 10a side (the operation side) with respect to the operation plate 10, the shapes and the positions of the frame part 31 and the bridge part 32 are set to as to make the operation surfaces 11 to 16 to be located at the openings 30a. The second elastic member 50 is similar to the first elastic member 30 that has a shape having the frame part and the bridge part, and has a plurality of openings 50a. The position of the opening 50a of the second elastic member 50 and the position of the opening 30a of the first elastic member 30 are identical as viewed from the operation side. In other words, the first elastic member 30 and the second elastic member 50 are arranged outside a region, which overlaps the operation surface 11 viewed from the direction of the pressing operation.

Between the bottom part 102 and the assembly member 60, the first electrode sheet 20, the first elastic member 30, the second electrode 40 and the second elastic member 50 are stacked in an extending direction of the cylindrical part 101 (the up-down direction illustrated in FIG. 3). In other words, the first electrode sheet 20, the first elastic member 30, the second electrode 40 and the second elastic member 50 are stacked and accommodated in an accommodation space arranged inside the operation plate 10 and the assembly member 60. The first elastic member 30 and the second elastic member 50 are accommodated in a state where the first elastic member 30 and the second elastic member 50 are elastically deformed in a stacking direction. The both surfaces of the first elastic member 30 are adhered to the first electrode sheet 20 and the second electrode 40 with an adhesive agent. The both surfaces of the second elastic member 50 are adhered to the second electrode 40 and the assembly member 60 with the adhesive agent.

The following describes a configuration of assembling the operation plate 10 and the assembly member 60 in detail. An engaging part 103 having an engaging surface 103a is provided at several locations of the cylindrical part 101 at the extended tip. An engaging hole 61, which is configured to be fitted by the engaging part 103, is arranged at a part of the side surface of the assembly member 60 to be opposite to the engaging part 103. With regard to the situation illustrated in FIG. 3, it is prevented that the engaging part 103 gets out from the engaging hole 61 by engaging the engaging surface 103a of the engaging part 103 to the target engaging surface 61a of the engaging hole 61 against the elastic forces exerted by the first elastic member 30 and the second elastic member 50.

When the operation plate 10 is assembled with the assembly member 60, in a situation where a taper surface 103b of the engaging part 103 is pressed to the corner part of the assembly member 60, the operation plate 10 is pressed in the stacking direction to the assembly member 60. Accordingly, the cylindrical part 101 deforms elastically in a direction in which the opening of the plate 10 is pressed and widen in a predetermined direction, and the engaging part 103 fits into the engaging hole 61.

Figure 4:
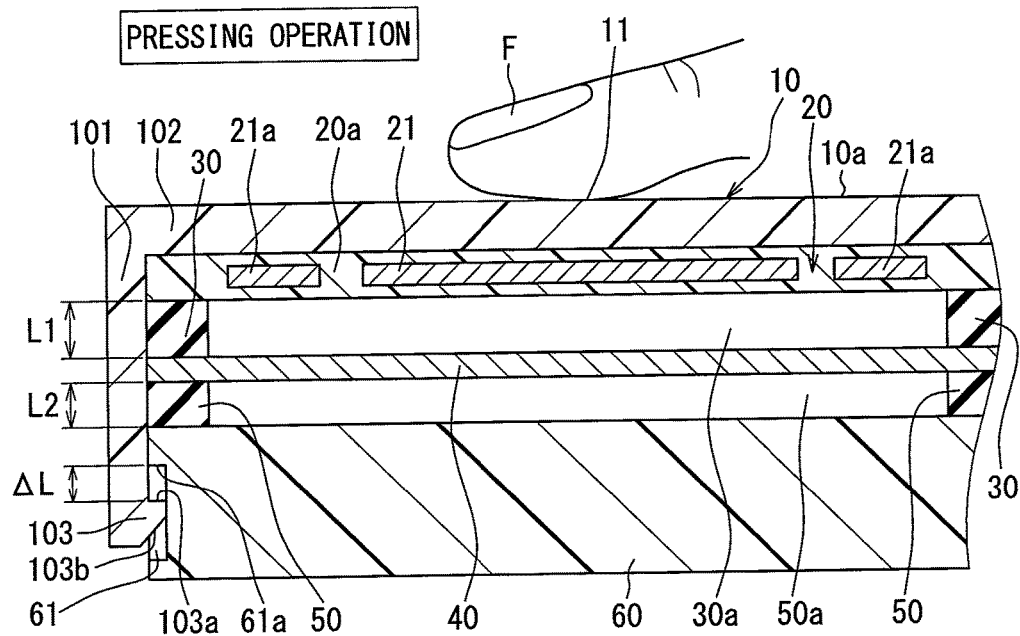
FIG. 4 is a cross sectional view that illustrates a state in which a pressing operation is performed at the operation apparatus according to the first embodiment.

FIG. 3 illustrates a situation in which a user's fingertip F (operation body) is in contact with the operation surface 11, in other words, a situation of having a contact operation. This situation remains an initial state in which the engaging surfaces 103a and 61a are abutted to each other. When the fingertip F performing a contact operation is further doing a pressing operation by pressing against the decorated surface 10a in a perpendicular direction, in other words, by pressing to the rear side in the stacking direction, the operation plate 10 moves toward the rear side relative to the assembly member 60 in the pressing direction as illustrated in FIG. 4. In particular, FIG. 4 illustrates a situation in which the engaging surface 103a moves away from the engaging surface 61a and moves into the engaging hole 61 when the first elastic member 30 and the second elastic member 50 are further elastically deformed and the operation surface 10 is pressed. The separation distance between the engaging surface 103a and the engaging surface 61a corresponds to a pressing amount ΔL caused by the pressing operation.

The difference between the thickness L1 of the first elastic member 30 at the time of the contact operation and the thickness L1 of the first elastic member 30 at the time of pressing operation is the amount of deformation in a situation where the first elastic member 30 is elastically deformed by having the pressing operation. This amount of deformation is described as the first deformation amount ΔL1 in the following. The difference between the thickness L2 of the second elastic member 50 at the time of the contact operation and the thickness L2 of the second elastic member 50 at the time of the pressing operation is the amount of deformation in a situation where the second elastic member 50 is elastically deformed by having the pressing operation. This amount of deformation is described as the second deformation amount ΔL2 in the following. The first elastic member 30 and the second elastic member 50 are aligned in the pressing operation direction. Accordingly, the pressing force caused by the pressing operation is exerted to the first elastic member 30 and the second elastic member 50 in series. Accordingly, the value of the pressing amount ΔL is obtained by adding the second deformation amount ΔL2 to the first deformation amount ΔL1.

In the following, the amount of elastic deformation of the first elastic member 30 at an initial state illustrated in FIG. 3 is described as the first initial deformation amount ΔL1a, and the amount of elastic deformation of the second elastic member 50 at an initial state is described as the first initial deformation amount ΔL2a. Both of the initial deformation amounts are caused by the assembly tolerance of the operation plate 10 and the assembly member 60 and thus variation occurs. For example, the variation occurs due to, for example, the tolerance of the extending length L3 of the cylindrical part 101, the tolerance of the dimension of the engaging hole 61, and the tolerance of the thickness of the first elastic member 30 and the thickness of the second elastic member 50.

The first electrode 21 and the second electrode 40 function as a sensor for detecting the first deformation amount ΔL1 occurred when having the pressing operation. The function is described in the following in detail.

When the above-mentioned contact operation is performed, the electrostatic capacitance C1 (see FIG. 3), which is formed between the first electrodes 21 to 26 and the fingertip F, changes. In addition, when the above-mentioned pressing operation is performed, the separation distance between the first electrodes 21 to 26 and the second electrode 40, in other words, the thickness L1 of the first elastic member 30 becomes smaller so that the electrostatic capacitance C2 (see FIG. 3) formed between the first electrodes 21 to 26 and the second electrode 40 changes.

The microcomputer 70 includes a CPU 70a and a memory 70b. The CPU 70a functions as a detector 72, a contact determinator 73 and a pressing determinator 74, which are described in the following, by executing a computing process according to a program stored in the memory 70b (see FIG. 2).

The detector 72 repeats charging and discharging on the first electrodes 21 to 26, which form the above-mentioned electrostatic capacitances C1 and C2 and counts the number of charging and discharging until meeting a predetermined requirement. As the combined capacitance obtained by the electrostatic capacitance C1 generated between the first electrodes 21 to 26 and the fingertip F and the electrostatic capacitance C2 generated between the first electrodes 21 to 26 and the second electrode 40 is larger, the count value becomes a larger value. Accordingly, the count value is a value that represents the electrostatic capacitance. The changing amount of the count value corresponds to the detection value of the sensor according to the electrostatic capacitance. It is noted that a predetermined voltage (for example, 1V) is applied to the first electrodes 21 to 26 during the charging process. The ground electrode 21a is connected to a ground terminal (not shown). The second electrode 40 is a floating electrode that does not connect to any of the terminals. The ground electrode 21a inhibits the influence of noise on the signal according to the electrostatic capacitance of the first electrodes 21 to 26.

The contact determinator 73 determines that the contact operation is performed when the detection value is larger than or equal to a first threshold value TH1 and the situation continues for longer than or equal to a predetermined time. The pressing determinator 74 determines that the pressing operation is performed when the detection value is larger than or equal to a second threshold value TH2. The first threshold value TH1 is set to be smaller than the second threshold value TH2.

Figure 5:
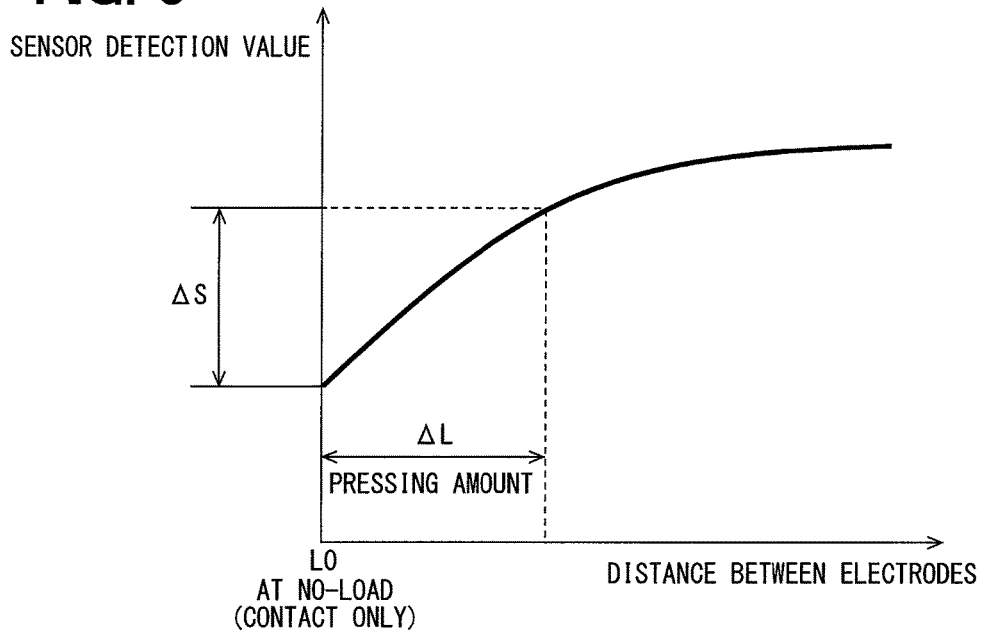
FIG. 5 illustrates a characteristic line representing a relation between the distance, which is between the electrodes, and a sensor's output value, and illustrates a changing amount of the detection value $\Delta S$ relative to the pressing amount $\Delta L$.

The curved line in FIG. 5 is a characteristic line that represents the relation between the detection value of the sensor and the separation distance between the first electrode 21 and the second electrode 40. This characteristic line is non-linear. The separation distance is the thickness L1 of the first elastic member 30. The reference numeral L0 in the figure represents the separation distance at the time of having the contact operation. FIG. 5 illustrates the changing amount ΔS of the detection value relative to the pressing amount ΔL caused by the pressing operation in a situation where the above-mentioned assembly tolerance is zero.

Figure 6:
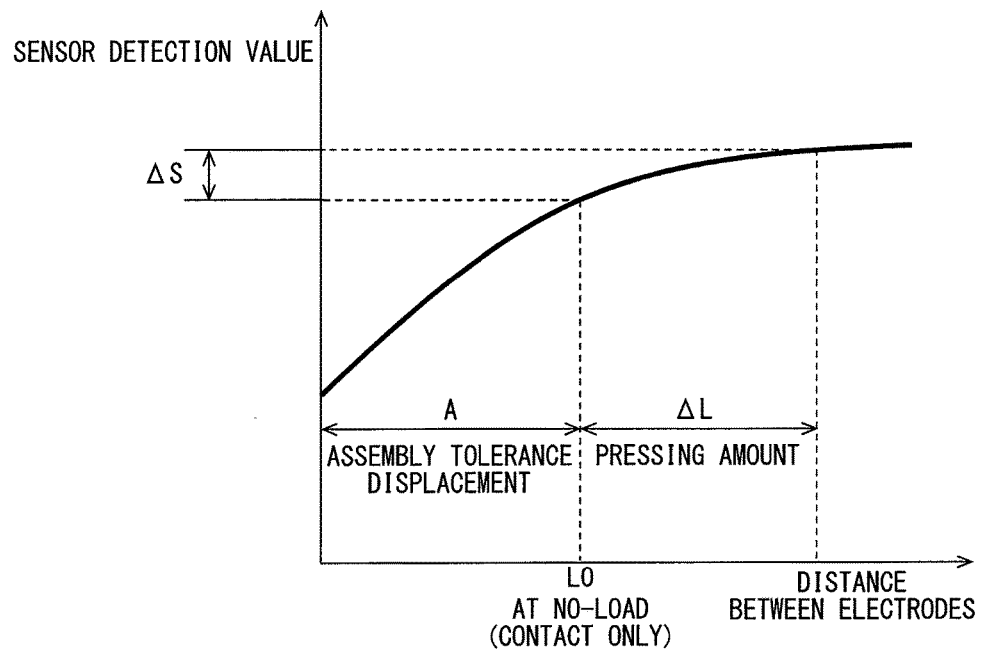
FIG. 6 illustrates a characteristic line representing a relation between the distance, which is between the electrodes, and a sensor's output value, and illustrates a changing amount of the detection value $\Delta S$ relative to the pressing amount $\Delta L$ in a situation where a displacement A caused by an assembly tolerance exists.

On the other hands, FIG. 6 illustrates the changing amount ΔS of the detection value relative to the pressing amount ΔL in a situation where the first initial deformation amount ΔL1a gets larger with an only smaller portion represented by the reference numeral A. Since the characteristic line is non-linear, the changing amount ΔS varies differently even when the even when the pressing amount is the same as shown in FIGS. 5 and 6. Accordingly, the determination accuracy of the pressing determinator 74 improves as the variation shown in the first initial deformation amount ΔL1a caused by the assembly tolerance gets smaller.

When it is determined that the contact operation is performed by the contact determinator 73, the microcomputer 70 may changes the setting content for the air conditioner 80 that corresponds to the operation surface 11 according to the contact operation. The activation, the setting of the air flow amount, and setting of the temperature for the above-mentioned air conditioner are examples of the setting. The microcomputer 70 outputs a command signal according to the setting to the air conditioner 80, and controls the activation of the air conditioner 80. The microcomputer 70 executes the setting change with regard to the setting content selected by the contact operation. For example, the air flow amount setting or the temperature setting for the air conditioner is changed.

It is noted that the operation apparatus 5 may also operates the audio device 81 or the navigation device 82 other than the air conditioner 80. In this situation, the microcomputer 70 outputs a command signal according to the content set by the operation apparatus 5 to the audio device 81 or the navigation device 82, and controls the activation of the audio device 81 or the navigation device 82.

In view of the above description, in the present embodiment, the second elastic member 50, which is not a detection target for the sensor, is provided separately from the first elastic member 50, which is a detection target for the sensor. The second elastic member 50 is sandwiched between the operation plate 10 and the assembly member 60, and is elastically deformed along with the first elastic member 30 by the pressing force. The first elastic member 30 and the second elastic member 50 are arranged such that the pressing force is applied serially.

In this situation, the tolerance assembly tolerance caused by the operation plate 10 and the assembly member 60 is absorbed by both of the first initial deformation amount and the second initial deformation amount. For example, even when the extension length of the cylindrical part 101 of the operation plate 10 is shorter than the target length by only the displacement A, it is added to the first initial deformation amount and the second initial deformation amount due to dispersion of the displacement A. Accordingly, the assembly tolerance becomes smaller by the portion added to the second initial deformation amount. Or alternatively, the variation in the first initial deformation amount becomes smaller caused by the assembly tolerance. The detection target of the first electrode 21 (sensor) is the elastic deformation amount of the first elastic member 30, and the second elastic member 50 is not the detection target. Accordingly, the variation in the first initial deformation amount becomes smaller so that the accuracy for determining whether the pressing operation is performed improves.

In a situation where the above setting is not adopted, the pressing amount due to the pressing operation is dispersed on both of the first elastic member 30 and the second elastic member 50 resulted from providing the second elastic member 50. Accordingly, the elastic deformation changing amount of the first elastic member 30 relative to the pressing amount becomes smaller by a portion which is dispersed to the second elastic member 50. Accordingly, it is a matter of concern that a sense of operation, which is determined as the pressing operation, is achieved with a very small pressing amount by setting the second threshold value ΔTH used in the pressing determinator 74. In view of this matter, in the present embodiment, the vertical elastic coefficient of the first elastic member 30 is set to be smaller than the vertical elastic coefficient of the second elastic member 50. In other words, the first elastic member 30 is softer than the second elastic member 50. Accordingly, setting the second threshold value ΔTH to be a smaller value can be inhibited, and hence, the matter of concern is addressed.

Moreover, in the present embodiment, the sensor has the first electrodes 21 to 26 and the second electrode 40 arranged so that the mutual separation distance changes with the pressing force. In addition, the sensor outputs the detection value based on a change in the electrostatic capacitance generated between the first electrodes 21 to 26 and the second electrode 40. The first elastic member 30 is arranged between the first electrodes 21 to 26 and the second electrode 40, and the second elastic member 50 is arranged to be opposite to the first elastic member 30 with respect to the second electrode 40. Accordingly, the elastic deformation changing amount of the first elastic member 30 is configured as the detection target of the sensor while the second elastic member 50 is configured not to be the detection target. Hence, a simple configuration is achieved.

Furthermore, in the present embodiment, the plurality of operation surfaces 11 to 16 are provided on the operation plate 10, and the first electrodes 21 to 26 are respectively provided to the plurality of the operation surfaces 11 to 16. It is also provided that the contact determinator 73 determines whether a contact operation is performed by any of the plurality of operation surfaces 11 to 16 based on change in the electrostatic capacitance at each of the first electrodes 21 to 26. Accordingly, the first electrodes 21 to 26 used in the pressing determination performed by the pressing determinator 74 can also be used for contact determination performed by the contact determinator 73. Accordingly, as compared to a situation where separate electrodes is used for each of the contact determinator 73 and the pressing determinator 74, the configuration of the operation apparatus 5 is made to be simpler.

Second Embodiment

The operation apparatus 5 is an electrostatic capacitive apparatus according to the first embodiment that determines whether a pressing operation is performed by detecting a change in the electrostatic capacitance generated by the pressing operation. In contrast, the present embodiment illustrated in FIG. 7 relates to a resistive apparatus that determines whether a pressing operation is performed by detecting a change in an electrical resistance generated by the pressing operation.

Figure 7:
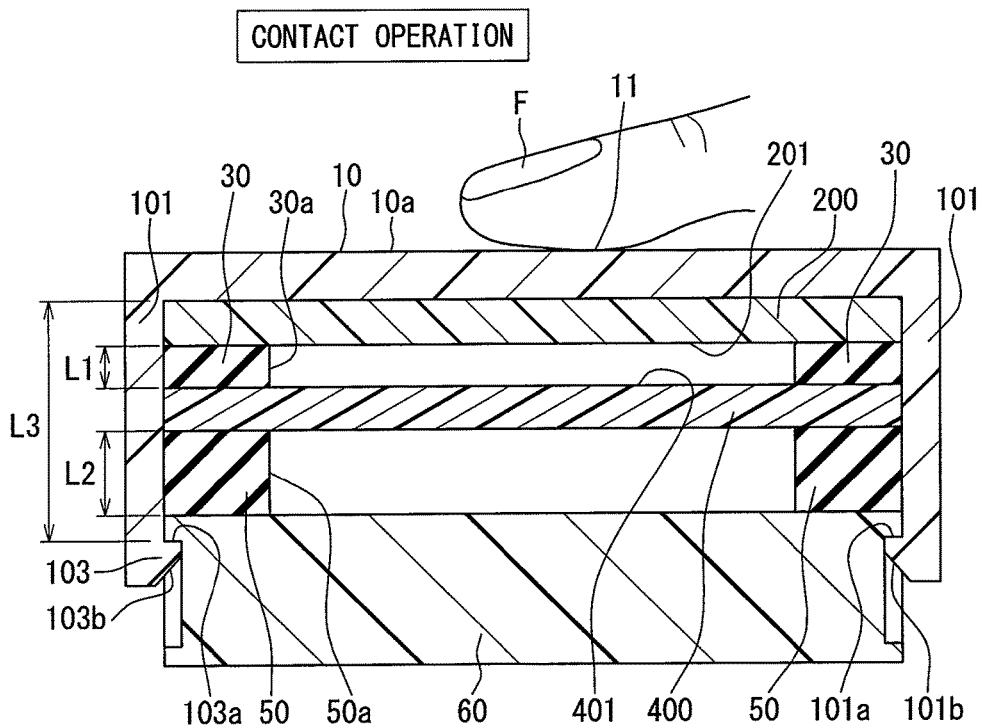
FIG. 7 is a cross sectional view that illustrates a state where a contact operation is performed at an operation apparatus according to a second embodiment of the present disclosure.

In particular, the first electrode sheet 20 and the second electrode 40 illustrated in FIG. 3 are respectively changed to a first conductive sheet 200 and a second conductive sheet 400 illustrated in FIG. 7. The conductive sheets 200 and 400 include: a resin-made sheet having an electrical insulation property; and an ink having electrical conductivity which is printed on the resin-made sheet. The surface of the first conductive sheet 200 on which the conductive ink is printed is called a first conductive surface 201, and the surface of the second conductive sheet 400 on which the conductive ink is printed is called the second conductive surface 401. The first conductive surface 201 and the second conductive surface 401 are opposite to each other. The first elastic member 30 is arranged between the first conductive sheet 200 and the second conductive sheet 400. The second elastic member 50 is arranged between the second conductive sheet 400 and the assembly member 60.

Figure 8:
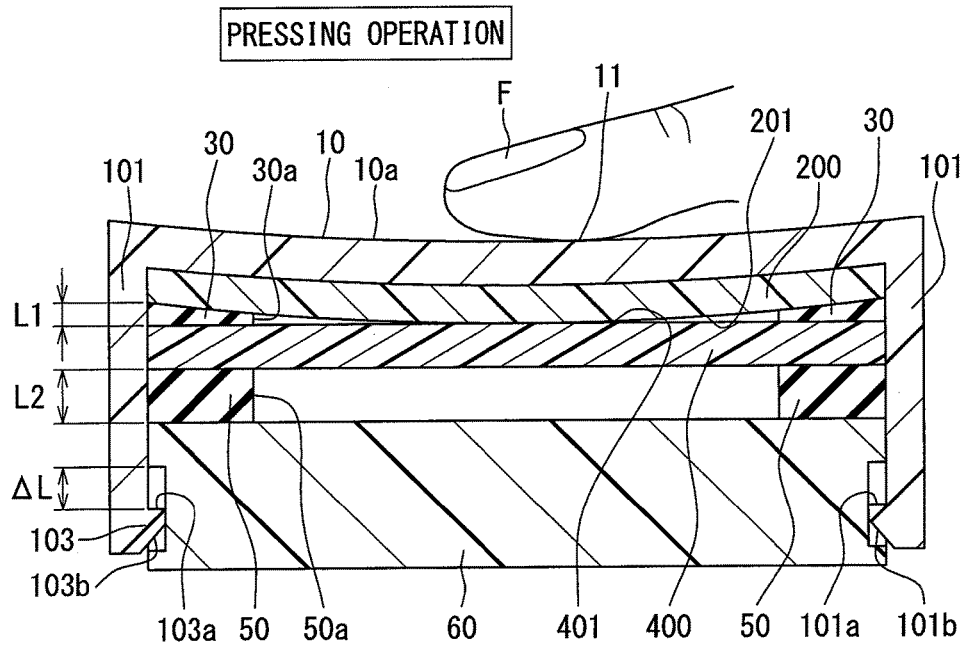
FIG. 8 is a cross sectional view that illustrates a state where a pressing operation is performed at the operation apparatus according to the second embodiment.

FIG. 7 illustrates a situation in which a contact operation is performed on the operation surface 11 with the fingertip F. This situation is at an initial state in which the engaging surfaces 103a and 61a are abutted to each other. When the pressing operation in which the fingertip F for performing the contact operation presses to the rear side in the stacking direction, the operation plate 10 moves towards a rear side relative to the assembly member 60 in the pressing direction as illustrated in FIG. 8. In particular, when the first elastic member 30 and the second elastic member 50 are elastically deformed while the operation plate 10 is pressed, the engaging surface 103a moves away from the engaging surface 61a, and the engaging part 103 moves into the engaging hole 61 as shown in FIG. 8. Moreover, the bottom part 102 of the operation plate 10 is elastically deformed by the pressing force. Specifically, the bottom part 102 is deformed in a curved line in the pressing direction as the cylindrical part 101 is set as a pivot point. The deformation amount curved at the central portion of the bottom part 102 is at the maximum.

When the deformation, which is curved as described above, occurs, the central portion of the bottom part 102 is located at the opening part 30a of the first elastic member 30 as shown in FIG. 8, and when the curved deformation is larger enough, the first conductive surface 201 is in contact with the second conductive surface 401. In a situation where the first conductive surface 201 is in contact with the second conductive surface 401, the operation plate 10 is further curved and deformed when the fingertip F further presses the operation plate 10. Then, the first conductive plane 201 is further pressed to the second conductive surface 401, and the contact area between the first conductive surface 201 and the second conductive surface 401 gets larger. As the contact area is larger, the resistance to an electrical current flowing from the first conductive surface 201 to the second conductive surface 401 gets smaller. In other words, as the pressing amount ΔL is larger, the electrical resistance is smaller, and a detector detects the electrical resistance. The pressing determinator 74 determines whether the pressing operation is performed based on a signal (detection signal) indicative of the electrical resistance detected by the detector. In the present embodiment, the first conductive surface 201 and the second conductive surface 401 function as a sensor that detects the first deformation amount ΔL1 generated along with the pressing operation.

As described above, in the present embodiment, the sensor is moved with the pressing force, and includes the first conductive surface 201 and the second conductive surface 401, which are in contact with each other, and outputs the detection signal according to the contact area between the first conductive surface 201 and the second conductive surface 401. The first elastic member 30 is arranged between the first conductive surface 201 and the second conductive surface 401, and the second elastic member 50 is arranged to be opposite to the first elastic member 30 with respect to the second conductive surface 401. Accordingly, the elastic deformation changing amount of the first elastic member 30 is set as the detection target of the sensor, and the second elastic member 50 is set not to be the detection target. Hence, the simple configuration is achieved.

Third Embodiment

Figure 9:
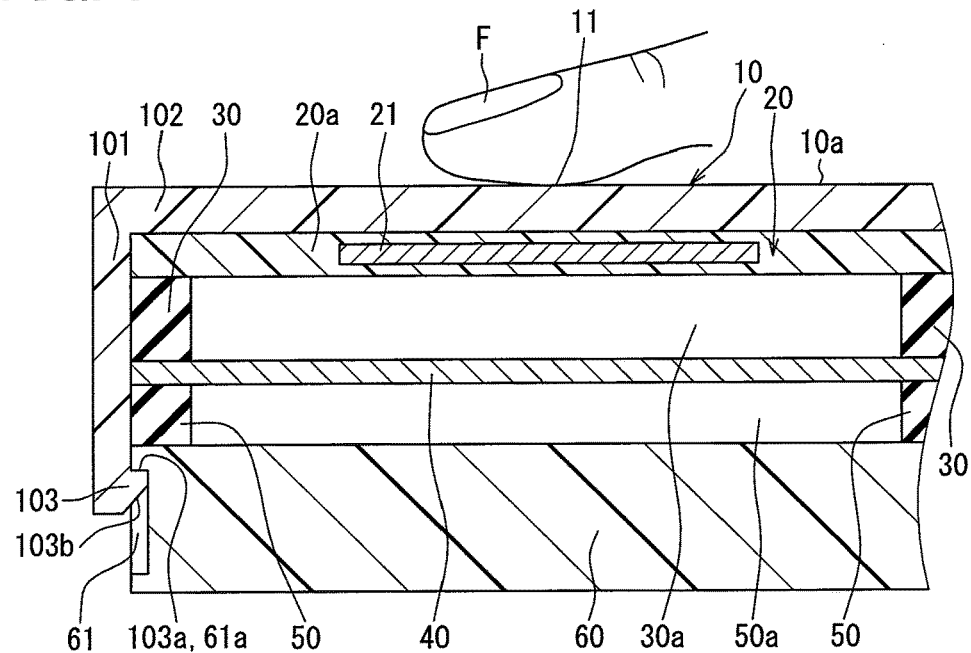
FIG. 9 is a cross sectional view that illustrates an operation apparatus according to a third embodiment of the present disclosure.

In the first embodiment as shown in FIG. 3, the first electrode sheet 20 includes the ground electrode 21a in addition to the first electrode 21. However, in this present embodiment, although a first electrode sheet 20 includes a first electrode 21, but it does not include a ground electrode as shown in FIG. 9. According to the present embodiment, the configuration of the first electrode sheet 20 can be made simpler as the ground electrode is not included.

Fourth Embodiment

Figure 10:
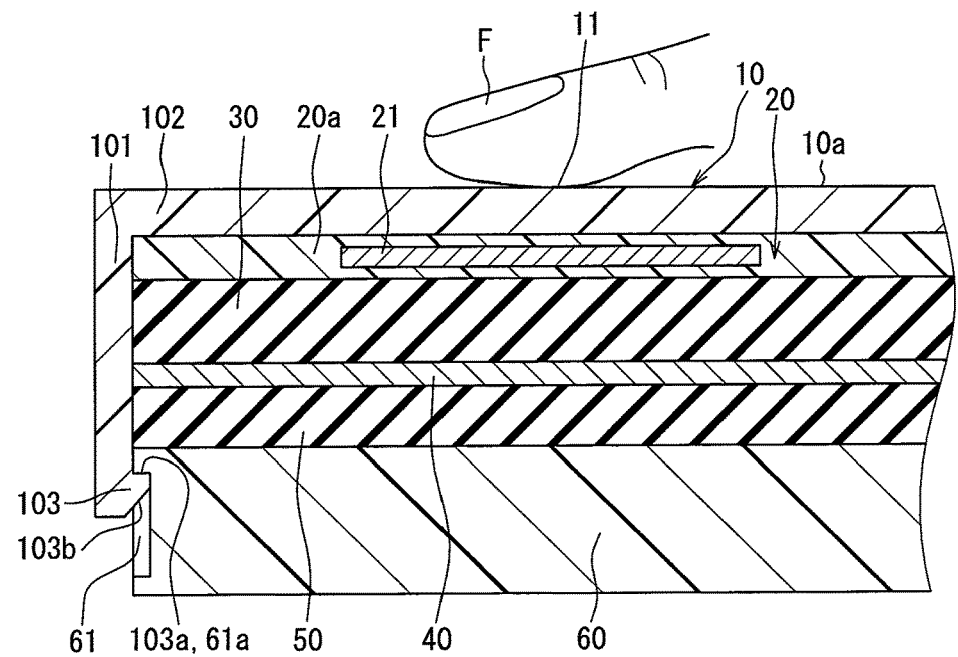
FIG. 10 is a cross sectional view that illustrates an operation apparatus according to a fourth embodiment of the present disclosure.

In the first embodiment as illustrated in FIG. 3, the opening part 30a is formed at the first elastic member 30. In addition, the opening part 50a is formed at the second elastic member 50. However, in the present embodiment, these opening parts are not included. As illustrated in FIG. 10, the first elastic member 30 and the second elastic member 30 is formed in a plate shape without having the opening part. According to the present embodiment, when the first elastic member 30 and the second elastic member 50 are pasted on a predetermined position, the pasting work is improved.

Fifth Embodiment

The present embodiment is modified from the above-mentioned first embodiment as described in the following. In other words, the material having translucency is used for the first electrodes 21 to 26, the ground electrode 21a and the sheet 20a. Moreover, in the present embodiment, a light source such as an LED for transmitted illumination on the operation surfaces 11 to 16. The light source is included for each of the operation surfaces 11 to 16, and is arranged to be opposite to the first elastic member 30 with respect to the second electrode 40.

As similar to the first embodiment, in the present embodiment, the first elastic member 30 and the second elastic member 50 are arranged outside a region overlapping the operation surfaces 11 to 16 viewed in a direction of the pressing operation. Accordingly, the first elastic member 30 and the second elastic member 50 cannot be visually recognized so that the operation surfaces 11 to 16 can be transmitted illuminated.

In the first embodiment, an image having a content for notifying whether any one of the plurality of operation surfaces 11 to 16 is selected is displayed on the display device 4. However, the present embodiment includes the light source, the operation surface selected by the contact operation is transmitted illuminated and hence can be notified.

OTHER EMBODIMENTS

The above describes the preferred embodiments of the invention, it is to be understood that the disclosure is not limited to the embodiments and constructions. It is possible to carry out various modified examples as described in the following. The present disclosure does not only refer to the combination of the parts, which are explicitly described as to be able to combine with other parts described in each of the embodiments, it is also possible to combine a part of the embodiments to other parts of the embodiments without specifically mentioned in the present disclosure as long as there is no problem occurred in the combination.

In each of the above embodiments, the thickness L1 of the first elastic member 30 and the thickness L2 of the second elastic member 50 are set to be the same at a state where the first elastic member 30 and the second elastic member 50 are not elastically deformed. However, it may be set that L1>L2 or L1<L2. In addition, in each of the above embodiments, the vertical elastic coefficient of the first elastic member 30 is set to be smaller than the vertical elastic coefficient of the second elastic member 50. However, the size relation of the vertical elastic coefficients can be set in reverse, or the size relation of the vertical elastic coefficients can be set to be the same.

In each of the above embodiments, the second elastic member 50 is arranged to be opposite to the first elastic member 30 with respect to the second electrode 40. However, the second elastic member 50 may also be arranged to be opposite to the first elastic member 30 with respects to the first electrodes 21 to 26.

The embodiment illustrated in FIG. 3 shows a configuration in which the first electrodes 21 to 26 are held inside the sheet 20a. A configuration in which the first electrodes 21 to 26 are printed on the surface of the sheet 20a may also be used instead of the above-mentioned configuration. In addition, the embodiment shown in FIG. 3 adopts a sheet-like second electrode 40. However, the configuration in which the second electrode 40 is held inside the resin-made sheet can also be used as similar to the first electrode sheet 20. In addition, the structure in which the second electrode 40 is printed on the surface of the resin-made sheet may also be used.

The configuration in which the first electrode sheet 20 is held at the sheet 20a may also be used as a variation example of the above-mentioned fourth embodiment illustrated in FIG. 10. The configuration in which the first electrode sheet 20 may be buried at the first elastic member 30 as illustrated in FIG. 10 may also be used.

In the above-mentioned first embodiment, the first electrodes 21 to 26 used for determination performed by the contact determinator 73 is used for the determination performed by the pressing determinator 74. However, in the present disclosure, the first electrodes 21 to 26 may also be used in the operation apparatus 5 without having the function of the contact determinator 73.

In each of the above embodiments, the operation plate 10, which is movable in a direction of the pressing operation, is assembled to the assembly member 60. In particular, the engaging part 103 moves into the engaging hole 61. However, when the operation plate 10, which is not movable, is assembled to the assembly member 60, the operation plate is elastically deformed and bent by the pressing operation, and the bending amount may be treated as the pressing operation amount.

The above embodiment assumes that a user operates the operation surfaces 11 to 16 by touching with his or her fingertip F. Hence, the fingertip F is treated as the operation body. However, the user may hold, for example, a pen-like operation member to operate the operation surfaces 11 to 16. In this situation, the operation member other than the human body may also function as the operation body. When the user wears a glove to make a contact operation on the operation surfaces 11 to 16, the glove functions as the operation body.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An operation apparatus comprising:
   an operation plate having an operation surface, which is configured to be performed by a pressing operation with an operation body;
   an assembly member that is assembled with the operation plate;
   a first elastic member that is arranged to be opposite to the operation surface with respect to the operation plate, and that is sandwiched between the operation plate and the assembly member to be elastically deformable by a pressing force applied by the operation body;
   a sensor that detects an elastic deformation changing amount of the first elastic member generated by the pressing operation;
   a pressing determinator that determines whether the pressing operation is performed based on a detection value of the sensor; and
   a second elastic member that is arranged between the operation plate and the assembly member, and that is elastically deformable with the first elastic member by the pressing force,
   wherein the first elastic member and the second elastic member are arranged to enable the pressing force applied to the first elastic member and the second elastic member serially,
   wherein the sensor includes a first electrode and a second electrode arranged such that a separation distance between the first electrode and the second electrode is changeable by the pressing force,
   wherein the sensor outputs the detection value based on a change in an electrostatic capacitance generated between the first electrode and the second electrode,
   wherein the first elastic member is arranged between the first electrode and the second electrode, and wherein the second elastic member is arranged to be opposite to the first elastic member with respect to the first electrode or the second electrode.

2. The operation apparatus according to claim 1, wherein a vertical elastic coefficient of the first elastic member is smaller than a vertical elastic coefficient of the second elastic member.

3. The operation apparatus according to claim 1, wherein a plurality of operation surfaces are arranged at the operation plate, and
wherein the first electrode is arranged for each of the plurality of operation surfaces,
the operation apparatus further comprising:
a contact determinator that determines whether a contact operation with the operation body is performed on one of the plurality of operation surfaces based on the change in the electrostatic capacitance corresponding to the first electrode.

4. An operation apparatus comprising:
an operation plate having an operation surface, which is configured to be performed by a pressing operation with an operation body;
an assembly member that is assembled with the operation plate;
a first elastic member that is arranged to be opposite to the operation surface with respect to the operation plate, and that is sandwiched between the operation plate and the assembly member to be elastically deformable by a pressing force applied by the operation body;
a sensor that detects an elastic deformation changing amount of the first elastic member generated by the pressing operation;
a pressing determinator that determines whether the pressing operation is performed based on a detection value of the sensor; and
a second elastic member that is arranged between the operation plate and the assembly member, and that is elastically deformable with the first elastic member by the pressing force,
wherein the first elastic member and the second elastic member are arranged to enable the pressing force applied to the first elastic member and the second elastic member serially,
wherein the sensor includes a first conductive surface and a second conductive surface, which are movable so as to be in contact with each other through the pressing force,
wherein the sensor outputs a detection signal corresponding to a contact area between the first conductive surface and the second conductive surface,
wherein the first elastic member is arranged between the first conductive surface and the second conductive surface, and
wherein the second elastic member is opposite to the first elastic member with respect to the first conductive surface or the second conductive surface.

* * * * *